United States Patent
Chang

(10) Patent No.: US 7,313,466 B2
(45) Date of Patent: Dec. 25, 2007

(54) SYSTEM AND METHOD FOR AUTOMATICALLY DETECTING A TYPE OF A CPU FAN

(75) Inventor: Yu-Chen Chang, Guangdong (CN)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 11/308,984

(22) Filed: Jun. 2, 2006

(65) Prior Publication Data

US 2007/0019383 A1 Jan. 25, 2007

(30) Foreign Application Priority Data

Jul. 9, 2005 (CN) .................. 2005 1 0035907

(51) Int. Cl.
*G05D 23/00* (2006.01)
*G01C 17/38* (2006.01)
*G01K 15/00* (2006.01)
*G01K 1/08* (2006.01)
*G06F 1/20* (2006.01)
*H05K 7/20* (2006.01)

(52) U.S. Cl. .................. 700/300; 702/96; 702/99; 702/132; 361/687; 361/688

(58) Field of Classification Search .......... 318/66; 700/300; 702/96, 99, 132; 361/687–688
See application file for complete search history.

(56) References Cited

U.S. PATENT DOCUMENTS

| | | | | |
|---|---|---|---|---|
| 5,163,145 A | | 11/1992 | Parks | |
| 5,249,741 A | * | 10/1993 | Bistline et al. | 236/49.3 |
| 5,727,928 A | * | 3/1998 | Brown | 417/44.11 |
| 6,392,372 B1 | * | 5/2002 | Mays, II | 318/254 |
| 6,414,843 B1 | * | 7/2002 | Takeda | 361/687 |
| 6,545,438 B1 | * | 4/2003 | Mays, II | 318/254 |
| 6,801,004 B2 | * | 10/2004 | Frankel et al. | 318/268 |
| 6,931,306 B2 | * | 8/2005 | Frankel et al. | 700/300 |
| 7,139,169 B2 | * | 11/2006 | Alperin et al. | 361/687 |
| 2006/0291160 A1 | * | 12/2006 | Freeman et al. | 361/687 |
| 2007/0050173 A1 | * | 3/2007 | Chen et al. | 702/182 |

* cited by examiner

*Primary Examiner*—Ronald Hartman, Jr.
(74) *Attorney, Agent, or Firm*—Winston Hsu

(57) ABSTRACT

An exemplary method for automatically detecting a type of a CPU fan includes: setting a PWM duty cycle of the CPU fan to a value of 100%; obtaining revolutions of the CPU fan at the PWM duty cycle in a fixed time period; calculating an RPM of the CPU fan as a full RPM; setting the PWM duty cycle of the CPU fan to another value below 100%; obtaining the revolutions of the CPU fan in the fixed time period, and calculating the RPM of the CPU fan as a test RPM; determining whether the test RPM is less than the full RPM; identifying the type of the CPU fan as a four-pin CPU fan if the test RPM is less than the full RPM; and identifying the type of the CPU fan as a three-pin CPU fan if the test RPM is not less than the full RPM.

9 Claims, 3 Drawing Sheets

SYSTEM AND METHOD FOR AUTOMATICALLY DETECTING A TYPE OF A CPU FAN

FIELD OF THE INVENTION

The present invention is generally related to a system and method for automatically detecting a type of a central processing unit (CPU) fan.

DESCRIPTION OF RELATED ART

It is known that a central processing unit (CPU) of a computer generates heat while operating. The higher the speed of the CPU is, the higher the temperature is. In order to avoid damage to the CPU and to have the CPU operate under an optimal working temperature, a CPU fan should be efficient enough to absorb and dissipate heat. Otherwise, the CPU may overheat and be unable to function normally or may even become permanently damaged.

In the traditional computer field, a three-pin CPU fan commonly has three connecting wires; one is used for monitoring the CPU fan's speed, and the other two are used for power. The three-pin CPU fan may include an extra pulse width modulation (PWM) controller that monitors signals from the CPU fan. A four-pin CPU fan is one that has an extra wiring in addition to the three connecting wires of the three-pin CPU. The extra wiring directly conducts a twelve volts voltage into the CPU fan, and the signals of the CPU fan are also monitored by the PWM controller. The three-pin CPU fan controls the voltage thereof using a voltage controlling circuit. A deteriorating of the four-pin CPU fan may be reduced if the CPU fan controls the voltage thereof by utilizing a voltage controlling circuit. When assembling computer system, a conventional method of detecting a type of a CPU fan is manual, not automated.

Therefore, what is needed is a method for automatically detecting a type of the CPU fan.

SUMMARY OF THE INVENTION

A system for automatically detecting a type of a Central Processing Unit (CPU) fan is provided in accordance with a preferred embodiment. The system includes a setting module, a revolution obtaining module, a fan speed calculating module and a comparing module. The setting module is used for setting two pulse width modulation (PWM) duty cycles of the CPU fan, which include a value of 100% and another value below 100%. The revolution obtaining module is used for obtaining revolutions of the CPU fan at the two PWM duty cycles respectively over a fixed time period through a sensor. The fan speed calculating module is used for calculating a full revolutions per minute (RPM) and a test RPM of the CPU fan corresponding to the two PWM duty cycles. The comparing module is used for comparing the full RPM with the test RPM and determining the type of the CPU fan according to the comparative results.

A method for automatically detecting a type of a CPU fan is provided. The method includes the steps of: setting a pulse width modulation (PWM) duty cycle of the CPU fan to 100%; obtaining revolutions of the CPU fan at the PWM duty cycle in a fixed period; calculating a revolutions per minute (RPM) of the CPU fan as a full RPM by dividing the obtained revolutions by the fixed period; setting the PWM duty cycle of the CPU fan to any value below 100%; obtaining the revolutions of the CPU fan in said fixed period, and calculating the RPM of the CPU fan as a test RPM by similar means in relation to the full RPM; determining whether the test RPM is less than the full RPM; identifying the type of the CPU fan as a four-pin CPU fan if the test RPM is less than the full RPM; and identifying the type of the CPU fan as a three-pin CPU fan if the test RPM is not less than the full RPM.

Other systems, methods, features, and advantages of the present invention will be or become apparent to one with skill in the art upon examination of the following drawings and detailed description.

DETAILED DESCRIPTION

Figure 1:
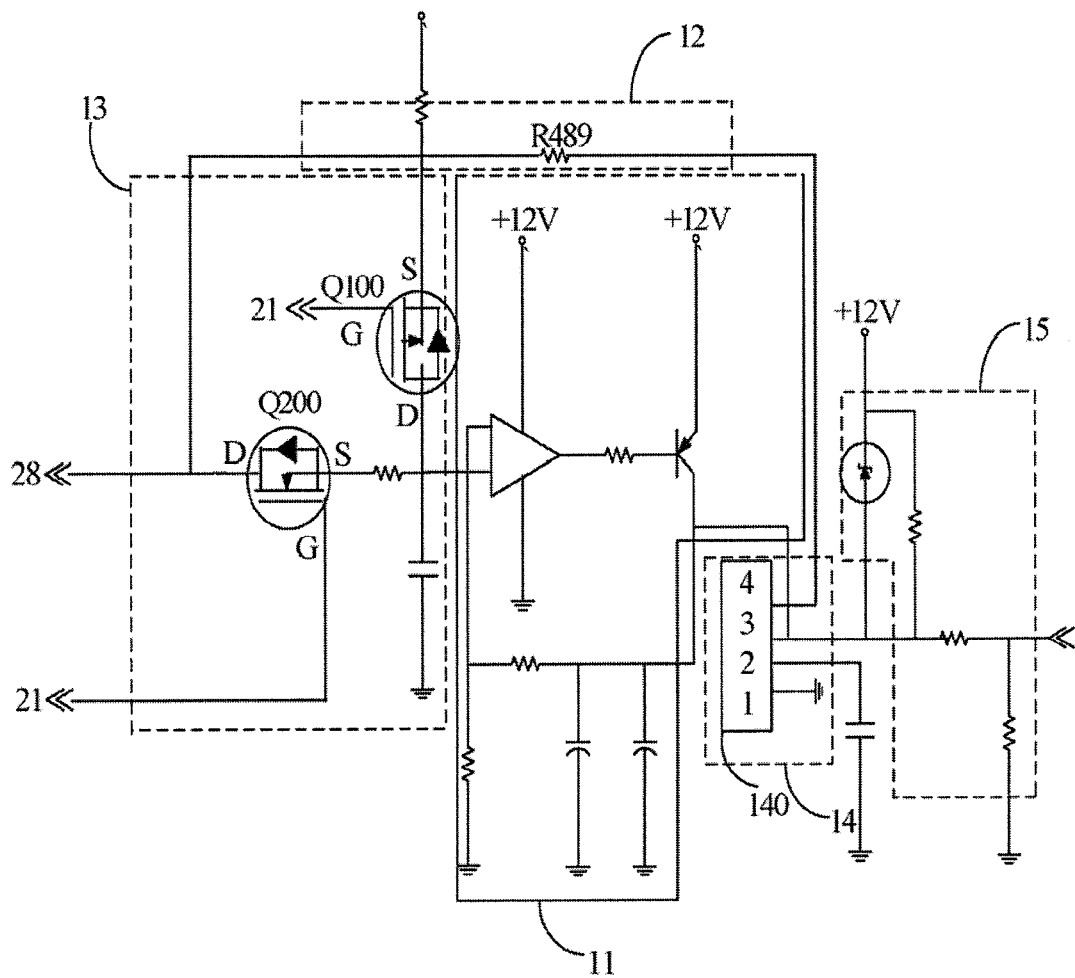
FIG. 1 is a schematic diagram of circuit modules of a pulse width modulation (PWM) voltage control circuit, in accordance with one embodiment of the present invention.

FIG. 1 is a schematic diagram of circuit modules of a pulse width modulation (PWM) voltage control circuit, in accordance with one preferred embodiment. The circuit modules typically include: a first voltage control module 11, a second voltage control module 12, a voltage switching module 13, a fan connector module 14, and a fan speed detecting module 15. The fan connector module 14 includes a CPU fan connector 140. The CPU fan connector 140 has wires that can be used for connecting a CPU fan. The CPU fan may be a thee-pin CPU fan or a four-pin CPU fan.

The first voltage control module 11 is used for providing a voltage that powers the PWM signal of the thee-pin central processing unit (CPU) fan. The second voltage control module 12 has a conductive wire that externally conducts a twelve volts voltage. The twelve volts voltage is used for powering the PWM signal of the four-pin CPU fan. The conductive wire has a resistance of 489 ohms.

The voltage switching module 13 is used for switching between the first voltage control module 11 and the second voltage control module 12. For example, if the CPU fan is the thee-pin CPU fan, the voltage switching module 13 switches to the first voltage control module 11. The voltage switching module 13 has a three-electrode tube Q100 (e.g., a Metal-Oxide-Semiconductor Field-Effect-Transistor or MOSFET) that is used for stabilizing the twelve volts voltage. The fan speed detecting module 15 has a sensor that is used for detecting a rotational speed of the CPU fan connected with the CPU fan connector 140. The principle of the fan speed detecting module 15 is as follows:

If a high potential signal is inputted in a port 21, the high potential signal enters a three-electrode tube Q200 (e.g., a MOSFET of the voltage switching module 13, and a grid (G) electrode of the Q200 conducts electricity to a drain (D) electrode of the Q200. At the same time, the high potential signal enters three-electrode tube Q100, a source (S) electrode of the Q100 disconnects with a D electrode of the Q100, and the Q100 provides the twelve volts voltage to the PWM signal. The PWM signal enters the voltage switching module 13 through a port 28, and the PWM signal controls the CPU fan by utilizing the second voltage control module 12. Then, the fan speed detecting module 15 detects a revolutions per minute (RPM) of the CPU fan over a fixed time period.

If a low potential signal is inputted in the port 21, the low potential signal enters the Q200, and the S electrode of the Q200 conducts electricity to the G electrode of the Q200. At the same time, the low potential signal enters the Q100, the S electrode conducts electricity to the D electrode of the Q100, and the Q100 does not provide the twelve volts voltage to the PWM signal. The PWM signal enters the voltage switching module 13 through the port 28, and the PWM signal controls the CPU fan by utilizing the first voltage control module 11. Then the fan speed detecting module 15 detects the RPM of the CPU fan over the fixed time period.

Figure 2:
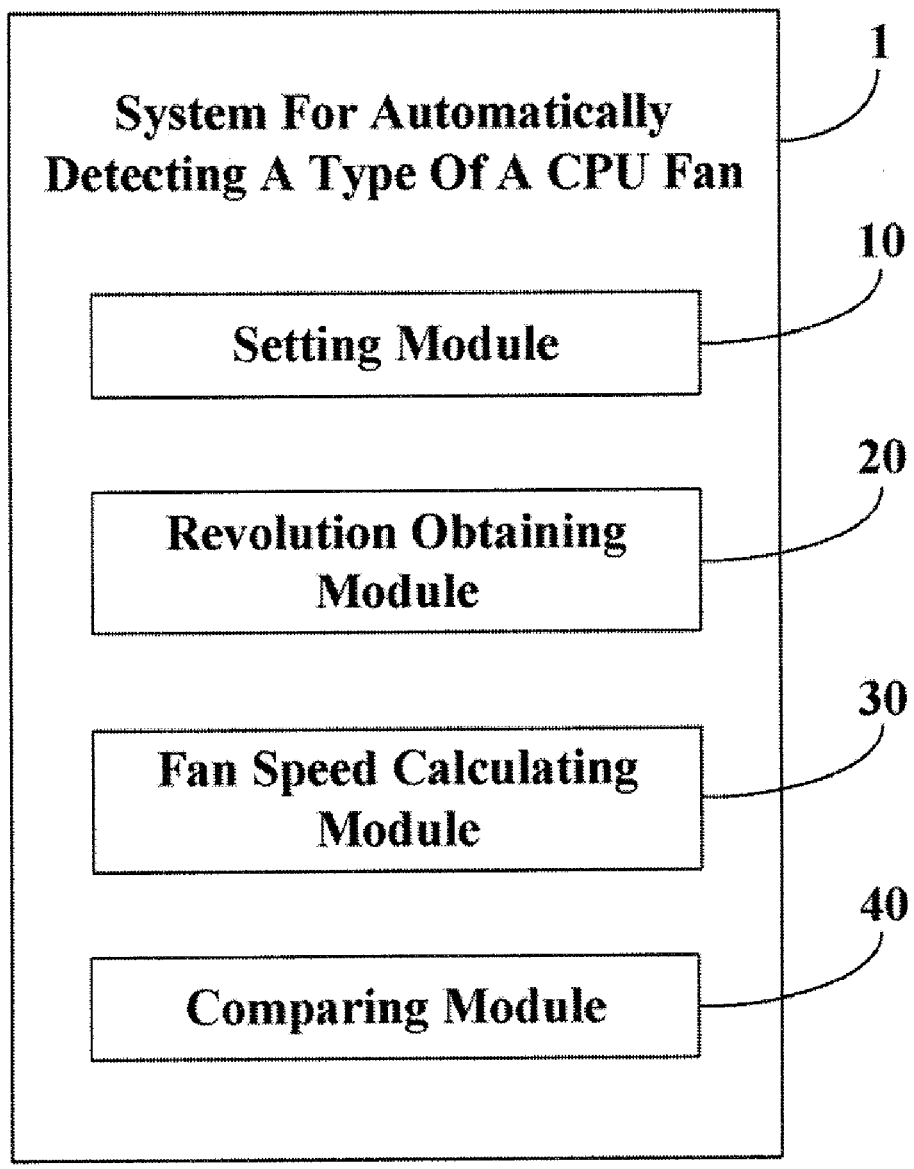
FIG. 2 is a schematic diagram of software function modules of a system for automatically detecting a type of a CPU fan, in accordance with one embodiment of the present invention.

FIG. 2 is a schematic diagram of software function modules of a system for automatically detecting a type of the CPU fan (hereinafter, "the system"), in accordance with one embodiment of the present invention. The system mainly includes: a setting module 10, a revolution obtaining module 20, a fan speed calculating module 30, and a comparing module 40. The setting module 10 is used for setting PWM duty cycles of the CPU fan. The PWM duty cycles include a value of 100% and another value below 100%. The revolution obtaining module 20 is used for obtaining the revolutions of the CPU fan detected by the sensor in the fan speed detecting module 15 over the fixed time period. The fixed time period can be set by the setting module 10 according to user requirements. The fan speed calculating module 30 is used for calculating the RPM of the CPU fan during the PWM duty cycles set by the setting module 10. The RPM of the CPU fan is considered as a full RPM if the PWM duty cycle is 100%, and the RPM of the CPU fan is considered as a test RPM if the PWM duty cycle is below 100%.

The comparing module 40 is used for comparing the full RPM with the test RPM. If the test RPM is less than the full RPM, the comparing module 40 identifies the type of the CPU fan as the four-pin CPU fan that is controlled by the twelve volts voltage directly. If the test RPM is larger than or equal to the full RPM, the comparing module 40 identifies the type of the CPU fan as the three-pin CPU fan that is controlled by the PWM voltage control circuit. Once the type of the CPU fan is identified, this information can for example be output for reference by a user via the comparing module 40.

Figure 3:
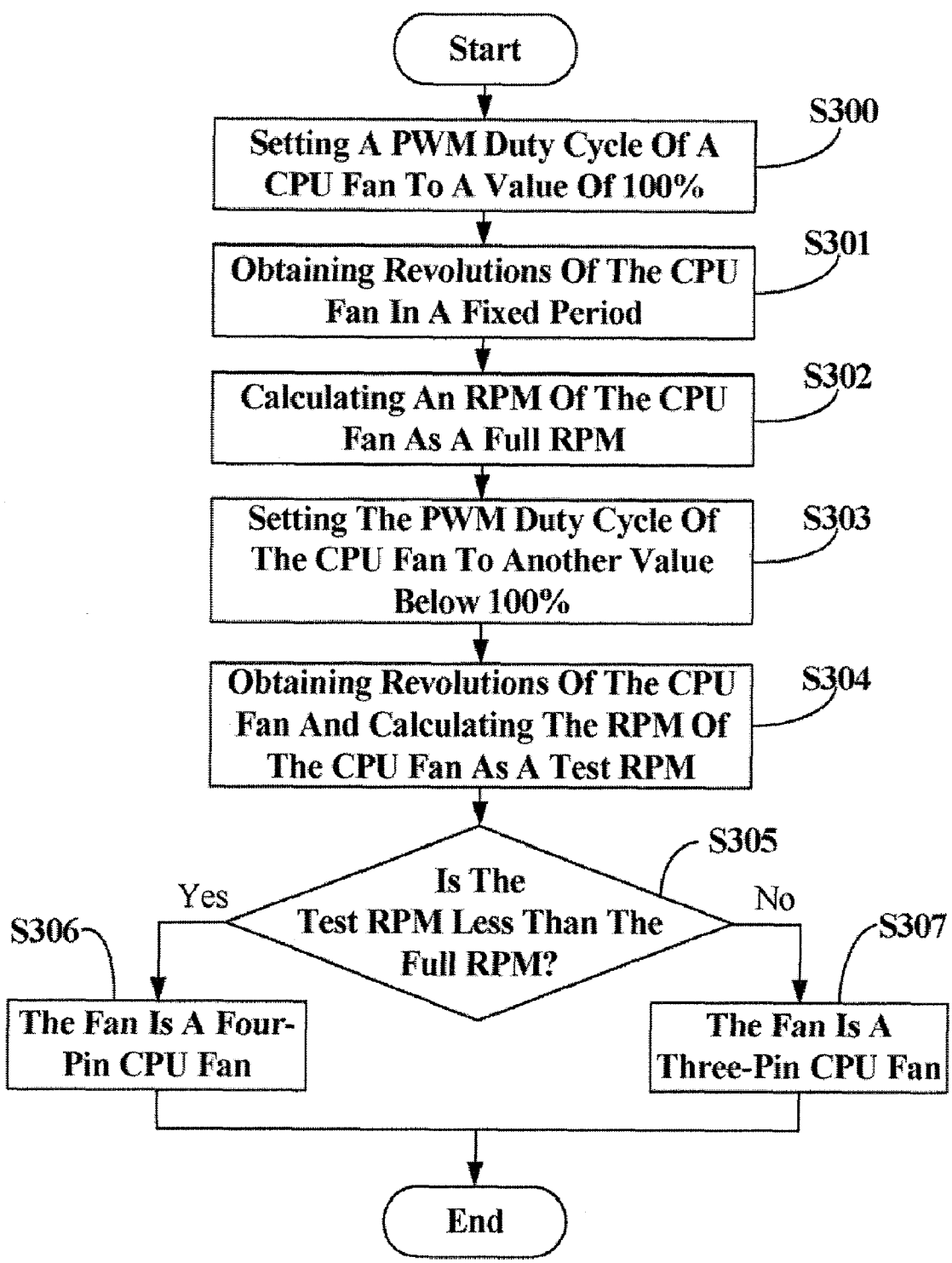
FIG. 3 is a flowchart of a preferred method for automatically detecting a type of a CPU fan, in accordance with one embodiment of the invention.

FIG. 3 is a flowchart of a preferred method for automatically detecting the type of the CPU fan. In step S300, the setting module 10 sets the PWM duty cycle of the CPU fan to a value of 100% in order to make the CPU fan run at a first speed. In step S301, the revolution obtaining module 20 obtains the revolutions of the CPU fan detected by the sensor over the fixed time period. In step S302, the fan speed calculating module 30 calculates the RPM of the CPU fan in the full RPM. In step S303, the setting module 10 sets the PWM duty cycle of the CPU fan to another value below 100% in order to make the CPU fan run at a second speed. In step S304, the revolution obtaining module 20 obtains the revolutions of the CPU fan detected by the sensor over the fixed time period, and the fan speed calculating module 30 calculates the RPM of the CPU fan as the test RPM. In step S305, the comparing module 40 compares the full RPM with the test RPM and determines whether the test RPM is less than the full RPM. In step S306, the comparing module 40 identifies the CPU fan as a four-pin CPU fan, if the test RPM is less than the full RPM. In step S307, the comparing module 40 identifies the CPU fan is as a three-pin CPU fan, if the test RPM is larger than or equal to the full RPM. Once the type of the CPU fan is identified, this information can for example be output for reference by a user via the comparing module 40.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A system for automatically detecting a type of a central processing unit (CPU) fan, the system comprising:
   a setting module configured for setting two pulse width modulation (PWM) duty cycles of the CPU fan, the two PWM duty cycles comprising a value of 100% and another value below 100%;
   a revolution obtaining module configured for obtaining revolutions of the CPU fan at the two PWM duty cycles respectively over a fixed time period through a sensor;
   a fan speed calculating module configured for calculating a full revolutions per minute (RPM) and a test RPM of the CPU fan corresponding to the two PWM duty cycles; and
   a comparing module configured for comparing the full RPM with the test RPM, determining the type of the CPU fan according to the comparative results, and outputting the type of the CPU fan.

2. The system according to claim 1, wherein the full RPM is the rotational speed of the CPU fan if the PWM duty cycle of the CPU fan is set to the value 100%.

3. The system according to claim 1, wherein the test RPM is the rotational speed of the CPU fan if the PWM duty cycle of the CPU fan is set to said another value below 100%.

4. The system according to claim 3, wherein the CPU fan is identified as a four-pin CPU fan, if the test RPM is less than the full RPM.

5. The system according to claim 4, wherein the CPU fan is identified as a three-pin CPU fan, if the test RPM is not less than the full RPM.

6. A method for automatically detecting a type of a central processing unit (CPU) fan, the method comprising:
   setting a pulse width modulation (PWM) duty cycle of the CPU fan to a value of 100%;
   obtaining revolutions of the CPU fan at the PWM duty cycle over a fixed time period;
   calculating revolutions per minute (RPM) of the CPU fan as a full RPM by dividing the obtained revolutions by the fixed time period;
   setting the PWM duty cycle of the CPU fan to another value below 100%;
   obtaining the revolutions of the CPU fan in the fixed time period, and calculating the RPM of the CPU fan as a test RPM by similar means in relation to the full RPM;
   comparing the full RPM with the test RPM and thereby determining whether the test RPM is less than the full RPM; and
   identifying the type of the CPU fan as a four-pin CPU fan if the test RPM is less than the full RPM; or
   identifying the type of the CPU fan as a three-pin CPU fan if the test RPM is not less than the full RPM; and
   outputting the type of the CPU fan.

7. A method for detecting a type of a central processing unit (CPU) fan, the method comprising:
- setting a pulse width modulation (PWM) duty cycle of the CPU fan to a value of 100%;
- obtaining revolutions of the CPU fan at the PWM duty cycle over a fixed time period;
- calculating revolutions per minute (RPM) of the CPU fan as a full RPM by dividing the obtained revolutions by the fixed time period;
- setting the PWM duty cycle of the CPU fan to another value below 100%;
- obtaining the revolutions of the CPU fan over the fixed time period, and calculating the RPM of the CPU fan as a test RPM by similar means in relation to the full RPM;
- comparing the full RPM with the test RPM; and
- outputting a result of the comparison, the result denoting the type of the CPU fan.

8. The method according to claim 7, wherein the result denotes that the CPU fan is identified as a four-pin CPU fan, if the test RPM is less than the full RPM.

9. The method according to claim 7, wherein the result denotes that the CPU fan is identified as a three-pin CPU fan, if the test RPM is not less than the full RPM.

* * * * *